US012787311B2

(12) United States Patent
Higuchi et al.

(10) Patent No.: US 12,787,311 B2
(45) Date of Patent: Nov. 3, 2026

(54) SUBSTRATE PROCESSING METHOD AND SUBSTRATE PROCESSING APPARATUS

(71) Applicant: Tokyo Electron Limited, Tokyo (JP)

(72) Inventors: Rintaro Higuchi, Kumamoto (JP); Mitsunori Nakamori, Kumamoto (JP); Koji Kagawa, Kumamoto (JP); Kenji Sekiguchi, Yamanashi (JP); Hajime Nakabayashi, Yamanashi (JP); Syuhei Yonezawa, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 417 days.

(21) Appl. No.: 18/275,908

(22) PCT Filed: Jan. 31, 2022

(86) PCT No.: PCT/JP2022/003513
§ 371 (c)(1),
(2) Date: Aug. 4, 2023

(87) PCT Pub. No.: WO2022/168773
PCT Pub. Date: Aug. 11, 2022

(65) Prior Publication Data

US 2024/0128307 A1 Apr. 18, 2024

(30) Foreign Application Priority Data

Feb. 8, 2021 (JP) ................................ 2021-018133

(51) Int. Cl.
*H10D 1/68* (2025.01)
*C23C 16/34* (2006.01)
(Continued)

(52) U.S. Cl.
CPC ............... *H10D 1/68* (2025.01); *C23C 16/34* (2013.01); *C23C 16/403* (2013.01); *C23C 16/405* (2013.01); *C23C 16/56* (2013.01)

(58) Field of Classification Search
CPC ....... C23C 16/34; C23C 16/303; C23C 16/40; C23C 16/403; C23C 16/405; C23C 16/56;
(Continued)

(56) References Cited

U.S. PATENT DOCUMENTS

2015/0147824 A1* 5/2015 Cameron .................. C07F 7/10 556/412
2019/0013195 A1* 1/2019 Kato .................. H10P 14/6339

FOREIGN PATENT DOCUMENTS

JP 2009-059889 A 3/2009
JP 2019-016778 A 1/2019
KR 20190005741 A 1/2019

OTHER PUBLICATIONS

International Search Report issued on Mar. 29, 2022 for WO 2022/168773 A1 (4 pages).

* cited by examiner

*Primary Examiner* — Brook Kebede
(74) *Attorney, Agent, or Firm* — Venjuris, P.C.

(57) ABSTRACT

A substrate processing method includes: (A) preparing a substrate, on which a high-dielectric film having a higher permittivity than a $SiO_2$ film is formed; (B) supplying, to the substrate, a metal solution containing a second metal element having a higher electronegativity or a lower valence than a first metal element contained in the high-dielectric film; and (C) forming a doping layer, in which the first metal element is substituted with the second metal element, on a surface of the high-dielectric film.

12 Claims, 10 Drawing Sheets

(51) Int. Cl.
*C23C 16/40* (2006.01)
*C23C 16/56* (2006.01)

(58) Field of Classification Search
CPC .......... H10D 1/68; H10D 1/684; H10P 14/46; H10P 14/60; H10P 14/6529; H10P 14/6508; H10P 14/6534; H10P 14/6538; H10P 14/6546; H10P 14/6548; H10P 14/662; H10P 14/6518; H10P 14/692; H10P 14/69392; H10P 14/69395; H10P 70/00; H10P 70/54; H10P 70/56; H10P 72/0448
See application file for complete search history.

SUBSTRATE PROCESSING METHOD AND SUBSTRATE PROCESSING APPARATUS

CROSS REFERENCE TO RELATED APPLICATIONS

This application is a national phase of PCT application No. PCT/JP2022/003513, filed on Jan. 31, 2022, which claims priority from Japanese patent application No. 2021-018133, filed on Feb. 8, 2021, all of which are incorporated herein by reference.

TECHNICAL FIELD

The present disclosure relates to a substrate processing method and a substrate processing apparatus.

BACKGROUND

A capacitor of a semiconductor layer disclosed in Patent Document 1 is formed by interposing a dielectric film between an upper electrode and a lower electrode. The dielectric film includes a film formed by alternately stacking hafnium oxide and titanium oxide at an atomic layer level.

PRIOR ART DOCUMENT

Patent Document

Patent Document 1: Japanese Patent Laid-Open Publication No. 2009-059889

SUMMARY OF THE INVENTION

Problems to be Solved

An aspect of the present disclosure provides a technology of reducing a leakage current of a high-dielectric film.

Means to Solve the Problem

A substrate processing method according to an aspect of the present disclosure includes: (A) preparing a substrate, on which a high-dielectric film having a higher permittivity than a $SiO_2$ film is formed; (B) supplying, to the substrate, a metal solution containing a second metal element having a higher electronegativity or a lower valence than a first metal element contained in the high-dielectric film; and (C) forming a doping layer, in which the first metal element has been substituted with the second metal element, on a surface of the high-dielectric film.

Effect of the Invention

According to an aspect of the present disclosure, a leakage current of a high-dielectric film may be reduced.

DETAILED DESCRIPTION TO EXECUTE THE INVENTION

Figure 1:
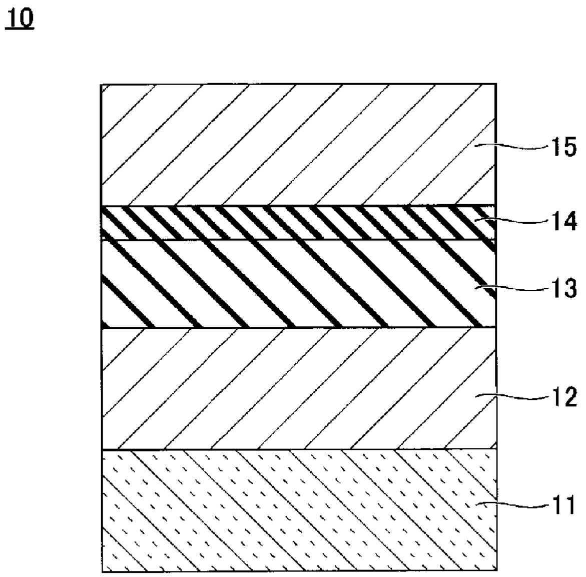
FIG. 1 is a cross-sectional view illustrating a substrate obtained by using a substrate processing method according to an embodiment.

Hereinafter, embodiments of the present disclosure will be described with reference to the drawings. In the respective drawings, the same or corresponding components will be denoted by the same reference numerals, and descriptions thereof may be omitted.

First, prior to describing a substrate processing method according to the present embodiment, a substrate 10 obtained by using the substrate processing method is described with reference to FIG. 1. The substrate 10 is a semiconductor device, and includes, for example, a capacitor. The substrate 10 includes, for example, a semiconductor substrate 11, a first electrode 12, a high-dielectric film 13, a doping layer 14, and a second electrode 15.

The semiconductor substrate 11 is, for example, a silicon wafer. The silicon wafer may contain a p-type dopant such as phosphorus or an n-type dopant such as boron. The semiconductor substrate 11 may be a compound semiconductor wafer. The compound semiconductor wafer is not particularly limited, but may be, for example, a GaAs wafer, a SiC wafer, a GaN wafer, or an InP wafer.

The first electrode 12 and the second electrode 15 are each, for example, a conductive film such as a TiN film. The TiN film is formed by, for example, an atomic layer deposition (ALD) method or a chemical vapor deposition (CVD) method. When the semiconductor substrate 11 contains a dopant, the first electrode 12 may be a portion of the semiconductor substrate 11.

The high-dielectric film 13 has a higher permittivity than an $SiO_2$ film. The high-dielectric film 13 includes, for example, a zirconium oxide film or a hafnium oxide film. The high-dielectric film 13 is formed by, for example, the ALD method or the CVD method. The high-dielectric film 13 has a single-layer structure in the present embodiment, but may have a multiple-layer structure. The high-dielectric film 13 having the multi-layer structure is configured with, for example, $ZrO_2$ film/$Al_2O_3$ film/$ZrO_2$ film, $ZrO_2$ film/$Al_2O_3$ film, or $HfO_2$ film/$Al_2O_3$ film. The high-dielectric film 13 having the multi-layer structure may include a zirconium oxide film or a hafnium oxide film at the uppermost layer where the doping layer 14 is formed.

The substrate processing method according to the present embodiment includes forming the doping layer 14 on the surface of the high-dielectric film 13, as described later, before forming the second electrode 15 on the surface of the high-dielectric film 13. The doping layer 14 is a so-called monolayer. As described in detail later, by forming the doping layer 14, the Schottky barrier may be modulated, so that the leakage current may be reduced while suppressing the increase in film thickness of the high-dielectric film 13.

Next, the substrate processing method according to the present embodiment will be described with reference to FIG. 2. The substrate processing method includes steps S101 to S108 illustrated in FIG. 2. The substrate processing method may not include all of steps S101 to S108 illustrated in FIG. 2, and may further include steps other than the illustrated steps.

Figure 3A:
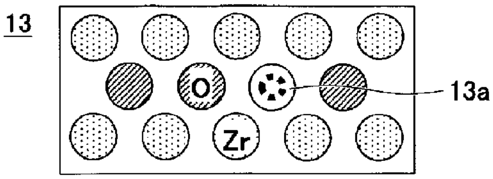
FIG. 3A is a cross-sectional view illustrating a substrate in S101 of FIG. 2.

Step S101 includes preparing the substrate 10. The preparing of the substrate 10 includes, for example, carrying the substrate 10 into a substrate processing apparatus 20 (see FIG. 11) to be described later. On the surface of the substrate 10, the second electrode 15 has not yet been formed, and the high-dielectric film 13 is exposed. The high-dielectric film 13 illustrated in FIG. 3A is a zirconium oxide film. The high-dielectric film 13 includes oxygen vacancies 13*a* that are formed during the formation of the high-dielectric film 13.

Figure 3B:
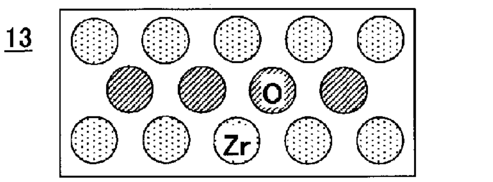
FIG. 3B is a cross-sectional view illustrating the substrate in S102 of FIG. 2.

Step S102 includes restoring the oxygen vacancies 13*a* in the high-dielectric film 13 with an oxidant, before forming the doping layer 14. An oxidizing chemical liquid is used as the oxidant. The oxidizing chemical liquid is, for example, ozone water, SC1 (an aqueous solution containing ammonium hydroxide and hydrogen peroxide), hydrogen peroxide water, or SPM (an aqueous solution containing sulfuric acid and hydrogen peroxide). As illustrated in FIG. 3B, the oxidant reduces the oxygen vacancies 13*a*, thereby reducing the paths of leakage current. Therefore, the leakage current may be reduced.

Step S102 above includes, for example, ejecting the oxidizing chemical liquid onto the surface of the high-dielectric film 13 from a nozzle disposed above the substrate 10, in a state where the substrate 10 is held horizontally with the high-dielectric film 13 facing upward, to form a liquid film of the oxidizing chemical liquid thereon. At that time, the substrate 10 may be rotated. Further, the nozzle may scan the substrate 10 in the radial direction. The nozzle may be a two-fluid nozzle, and may supply a mist of the oxidizing chemical liquid to the substrate 10. The oxidizing chemical liquid is recovered by a cup 26 (see FIG. 11).

Step S102 above may include immersing the substrate 10 in the oxidizing chemical liquid stored in a processing tank. In the case of immersing the substrate 10 in the oxidizing chemical liquid, a plurality of substrates 10 may be collectively processed.

Figure 3C:
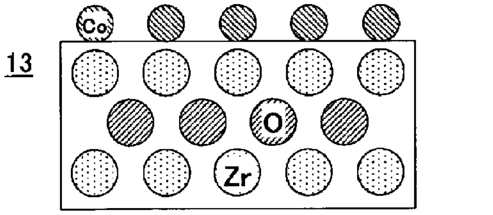
FIG. 3C is a cross-sectional view illustrating the substrate in S103 of FIG. 2.

Step S103 includes supplying a metal solution, which contains a second metal element having a higher electronegativity or a lower valence than a first metal element contained in the high-dielectric film 13, to the substrate 10. As illustrated in FIG. 3C, when the high-dielectric film 13 is zirconium oxide, the first metal element is zirconium (Zr). Further, when the high-dielectric film 13 is hafnium oxide, the first metal element is hafnium (Hf). Both Zr and Hf have a valence of 4.

As described above, the metal solution contains the second metal element that has the higher electronegativity or the lower valence than the first metal element. The second metal element may have the higher electronegativity and the lower valence than the first metal element. As described below, by substituting the first metal element contained in the high-dielectric film 13 with the second metal element contained in the metal solution, dipoles may be formed on the surface of the high-dielectric film 13.

The second metal element includes one or more selected from, for example, Co, Ni, Mo, W, V, Cr, and Nb. From the viewpoint of the substitutability with the first metal element, it is preferable that the second metal element has a small difference in ionic radius from the first metal element. Accordingly, the second metal element includes one or more selected from Co, Ni, and Nb. Co, Ni, and Nb have a small difference in ionic radius from Zr and Hf. The second metal element illustrated in FIG. 3C is Co.

The metal solution is, for example, an aqueous solution of an inorganic acid salt containing the second metal element. The inorganic acid salt is not particularly limited, but is, for example, sulfate, or nitrate.

The metal solution may include an organic solvent having an excellent hydration property to improve the wettability with the high-dielectric film 13. As for the organic solvent, for example, IPA or acetone is used. By improving the wettability of the metal solution, the rate for substituting the first metal element contained in the high-dielectric film 13 with the second metal element contained in the metal solution may be improved.

Step S103 above includes, for example, ejecting the metal solution from the nozzle disposed above the substrate 10 onto the surface of the high-dielectric film 13, in a state where the substrate 10 is held horizontally with the high-dielectric film 13 facing upward, to form the liquid film of the metal solution. At that time, the substrate 10 may be rotated. Further, the nozzle may scan the substrate 10 in the radial direction. The nozzle may be a two-fluid nozzle, and may supply a mist of the metal solution to the substrate 10. The metal solution is recovered by the cup 26 (see FIG. 11).

Further, step S103 above may include immersing the substrate 10 in the metal solution stored in the processing tank. When the substrate 10 is immersed in the metal solution, a plurality of substrates 10 may be collectively processed.

Figure 3D:
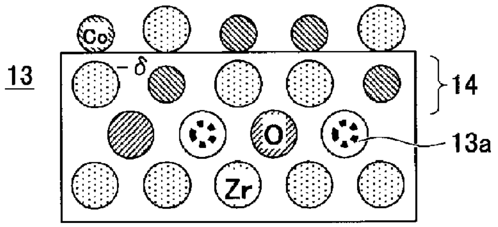
FIG. 3D is a cross-sectional view illustrating the substrate in S104 of FIG. 2.

Step S104 includes forming the doping layer 14, in which the first metal element has been substituted with the second metal element, on the surface of the high-dielectric film 13. As illustrated in FIG. 3D, the first metal element contained in the high-dielectric film 13 is substituted with the second metal element contained in the metal solution. As a result, the doping layer 14 is formed with a predetermined depth from the surface of the high-dielectric film 13. The doping layer 14 is a monolayer, and its thickness is, for example, one to five times the atomic radius of the second metal element. The doping that forms the monolayer is generally referred to as a monolayer doping (MLD).

Figure 4:
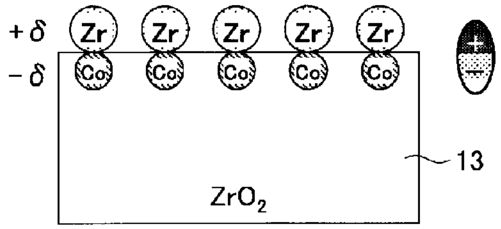
FIG. 4 is a cross-sectional view illustrating an example of dipoles formed on the surface of a high-dielectric film.
Figure 5:
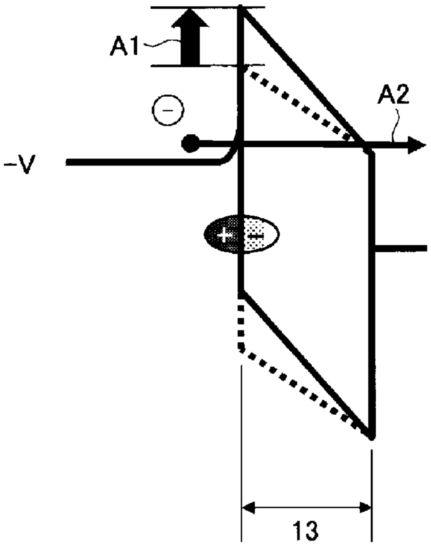
FIG. 5 is a view illustrating an example of the rise of the Schottky barrier due to dipoles.

As described above, the second metal element has the higher electronegativity or the lower valence than the first metal element. Accordingly, dipoles may be formed on the surface of the high-dielectric film 13 as illustrated in FIG. 4. As a result, the Schottky barrier may be modulated as indicated by an arrow A1 in FIG. 5, so that the flow of electrons indicated by an arrow A2 in FIG. 5 may be stopped. Accordingly, the leakage current may be reduced while suppressing the increase in film thickness of the high-dielectric film 13.

The surface density of the second metal element on the surface of the high-dielectric film 13 is, for example, $1\times10$ atoms/cm$^2$ or more and $1\times10^{15}$ atoms/cm$^2$ or less. The surface density of the second metal element is measured by a secondary ion mass spectrometry (SIMS), an inductively coupled plasma mass spectrometry (ICP-MS), or a total reflection X-ray fluorescence (TXRF) analysis method.

When the surface density of the second metal element on the surface of the high-dielectric film 13 falls within a desired range, a post-cleaning such as a rinsing may not be performed after step S104. When the second metal element is excessive, the post-cleaning is performed.

As described above, however, step S104 includes substituting the first metal element contained in the high-dielectric film 13 with the second metal element having the higher electronegativity or the lower valence than the first metal element. As a result, new oxygen vacancies 13*a* may be generated as illustrated in FIG. 3D, to balance the charges.

Figure 3E:
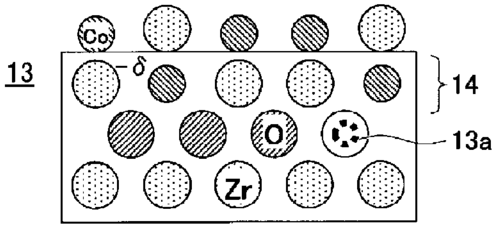
FIG. 3E is a cross-sectional view illustrating the substrate in S105 of FIG. 2.

Step S105 includes restoring the oxygen vacancies 13*a* in the high-dielectric film 13 with an oxidant, after forming the doping layer 14. As for the oxidant, the oxidizing chemical liquid is used as in step S102 above, and the oxidizing chemical liquid is supplied to the substrate 10. As illustrated in FIG. 3E, the oxidant reduces the oxygen vacancies 13*a*, thereby reducing the paths of leakage current.

Further, the oxidizing chemical liquid may be supplied to the substrate 10 simultaneously with the supply of the metal solution. That is, the formation of the doping layer 14 (step S104) and the restoration of the oxygen vacancies 13*a* (step S102 or S105) may be performed simultaneously.

The restoration of the oxygen vacancies 13*a* is a wet process in the present embodiment, but may be a dry process. For example, step S105 may include restoring the oxygen vacancies 13*a* in the high-dielectric film 13 by heating the substrate 10 in an atmosphere containing oxygen gas, after forming the doping layer 14. The temperature for heating the substrate 10 is, for example, 80° C. to 500° C., preferably 100° C. to 350° C. Most of the atmosphere may be an inert gas such as nitrogen gas as long as the atmosphere contains oxygen gas. The atmosphere may be the air atmosphere.

Further, step S105 may include restoring the oxygen vacancies 13*a* in the high-dielectric film 13 by irradiating the substrate 10 with a UV light in the atmosphere containing oxygen gas, after forming the doping layer 14. The irradiation with the UV light produces ozone, and the ozone restores the oxygen vacancies 13*a*. The wavelength of the UV light is not particularly limited, but is, for example, 172 nm or 365 nm.

Further, step S105 may include a plurality of processes for restoring the oxygen vacancies 13*a*. The combination of the processes is not particularly limited.

Step S106 includes cleaning the substrate 10. For example, step S106 includes cleaning the back surface (e.g., the lower surface) of the substrate 10 opposite to the doping layer 14, or the bevel of the substrate 10 with a cleaning liquid, to remove the second metal element adhering to the back surface or the bevel. Both the back surface and the bevel may be cleaned. The cleaning liquid includes an inorganic acid. The cleaning liquid is, for example, hydrofluoric acid, dilute hydrochloric acid, SC2 (an aqueous solution containing hydrochloric acid and hydrogen peroxide), SPM, or royal water. The second metal element may be prevented from adhering to a transfer device that transfers the substrate 10.

Step S106 above includes, for example, ejecting the cleaning liquid from a nozzle disposed below the substrate 10, in a state where the substrate 10 is held horizontally with the high-dielectric film 13 facing upward. At that time, the substrate 10 may be rotated. The nozzle may be a two-fluid nozzle, and a mist of the cleaning liquid may be supplied to the substrate 10. The cleaning liquid is recovered by the cup 26 (see FIG. 11).

Step S107 includes drying the substrate 10. The method of drying the substrate 10 is, for example, a spin drying, a supercritical drying, or the Marangoni drying. The drying methods use an organic solvent such as IPA. Compared to pure water, the organic solvent may reduce the surface tension acting on the substrate surface, which may suppress a pattern collapse on the substrate surface. The organic solvent is supplied in a liquid or gas state to the substrate 10. For example, nitrogen gas may be supplied to the substrate 10, together with the organic solvent. In the supercritical drying, the substrate 10 is dried by substituting the liquid film of the organic solvent formed in advance on the upper surface of the substrate 10 with a supercritical fluid.

Before drying the substrate 10, the substrate 10 may be subjected to a water repelling with a water repellent, to reduce the surface tension of the organic solvent that acts on the substrate surface. The water repellent is not particularly limited, but is, for example, (trimethylsilyl)dimethylamine (N,N-dimethyltrimethylsilylamine: TMSDMA) or hexamethyldisilazane (1,1,1,3,3,3-hexamethyldisilazane: HMDS).

Step S108 includes carrying the substrate 10 out from the substrate processing apparatus 20. Then, the second electrode 15 is formed on the doping layer 14 of the substrate 10.

Figure 2:
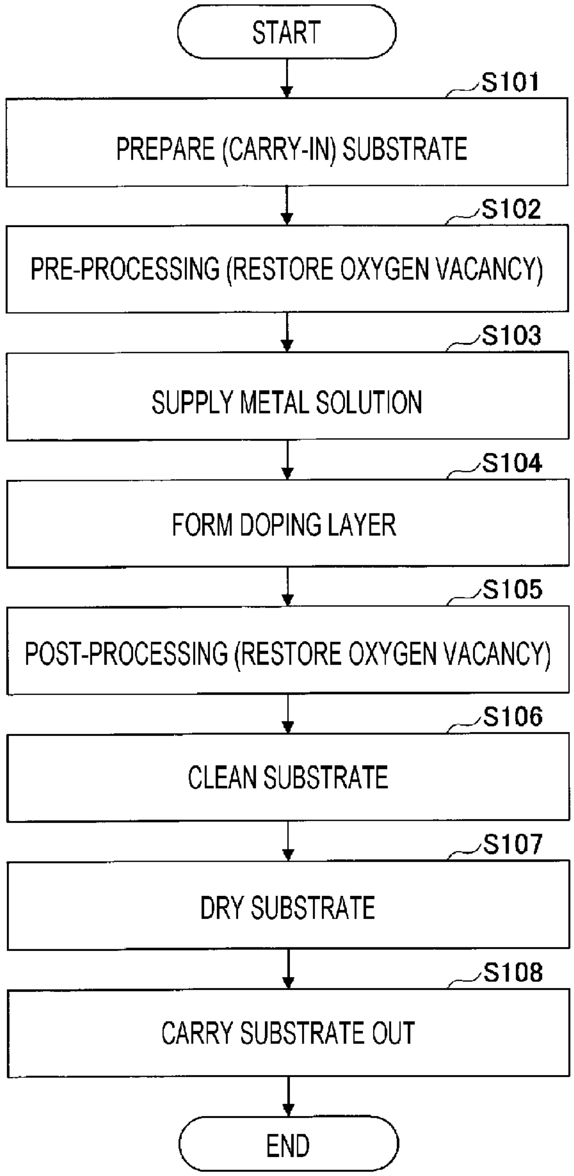
FIG. 2 is a flow chart illustrating the substrate processing method according to an embodiment.

The substrate processing method may further include steps other than the steps illustrated in FIG. 2. For example, the substrate processing method may include cleaning the cup 26 or a processing container 21 to remove the second metal element adhering to the cup 26 or the processing container 21. The cleaning of the cup 26 uses an aqueous solution of inorganic acid. The cleaning of the processing container 21 uses a gas.

Next, experimental data will be described with reference to, for example, Table 1. Table 1 represents process conditions of Examples 1 to 8. In Examples 1 to 8, a TiN film, a $ZrO_2$ film, and a TiN film were formed in this order on a silicon wafer under the same process conditions, except for the process conditions represented in Table 1. The film thickness of the $ZrO_2$ film was 5 nm. Example 1 is a Comparative Example, and Examples 2 to 8 are Examples of the present disclosure.

TABLE 1

| | Doping Process | Pre-Processing SPM + DHF | First Post-Processing Heating | Second Post-Processing $H_2O_2$ |
|---|---|---|---|---|
| Example 1 | Not performed | Not performed | Not performed | Not performed |
| Example 2 | Performed | Not performed | Not performed | Not performed |
| Example 3 | Performed | Not performed | Not performed | Performed |
| Example 4 | Performed | Not performed | Performed | Not performed |
| Example 5 | Performed | Not performed | Performed | Performed |
| Example 6 | Performed | Performed | Not performed | Not performed |
| Example 7 | Performed | Performed | Not performed | Performed |
| Example 8 | Performed | Performed | Performed | Performed |

In the "Doping Process" of Table 1, the substrate was immersed in an aqueous solution containing 10 mass ppm of Co ions for 30 minutes, before forming the TiN film on the surface of the $ZrO_2$ film, and subsequently, dried by compressed air. In the "Pre-Processing," after the formation of the $ZrO_2$ film and before the doping process, SPM was supplied to the surface of the $ZrO_2$ film for 1 minute, and subsequently, DHF (dilute hydrofluoric acid) was supplied thereto for 1 minute. SPM with a mass ratio of 6:1 between sulfuric acid and hydrogen peroxide ($H_2SO_4$:$H_2O_2$=6:1) was used. DHF with a mass ratio of 1:100 between hydrofluoric acid and water ($H_2O_2$:$H_2O$=1:100) was used. In the first post-processing, after the doping process and before the formation of the TiN film, the substrate was subjected to a heating process at 100° C. in the air atmosphere. In the second post-processing, after the doping process and before the formation of the TiN film, the substrate was immersed in hydrogen peroxide water for 10 seconds, and subsequently, dried by compressed air. Hydrogen peroxide water containing 1.5 mass % of $H_2O_2$ was used.

Figure 6:
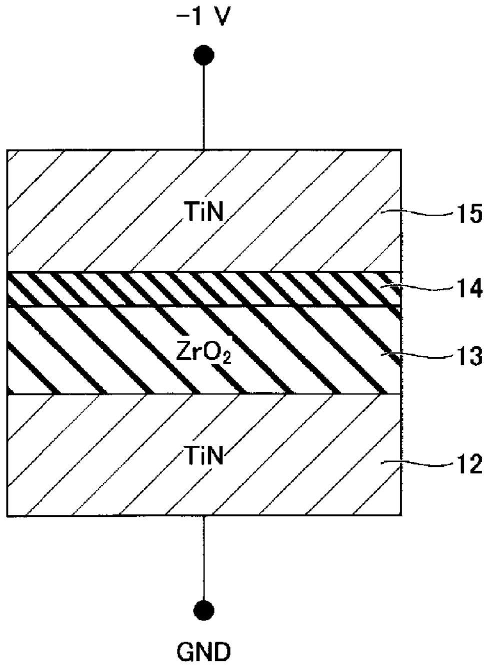
FIG. 6 is a view illustrating an example of a method for testing a leakage current of the high-dielectric film.

In each of Examples 1 through 8, 60 specimens were prepared under the process conditions represented in Table 1. As illustrated in FIG. 6, a voltage was applied to each specimen to measure the leakage current. In Example 1, the doping process was not performed as represented in Table 1. Accordingly, the specimens prepared in Example 1 did not have the doping layer 14 illustrated in FIG. 6.

Figure 7:
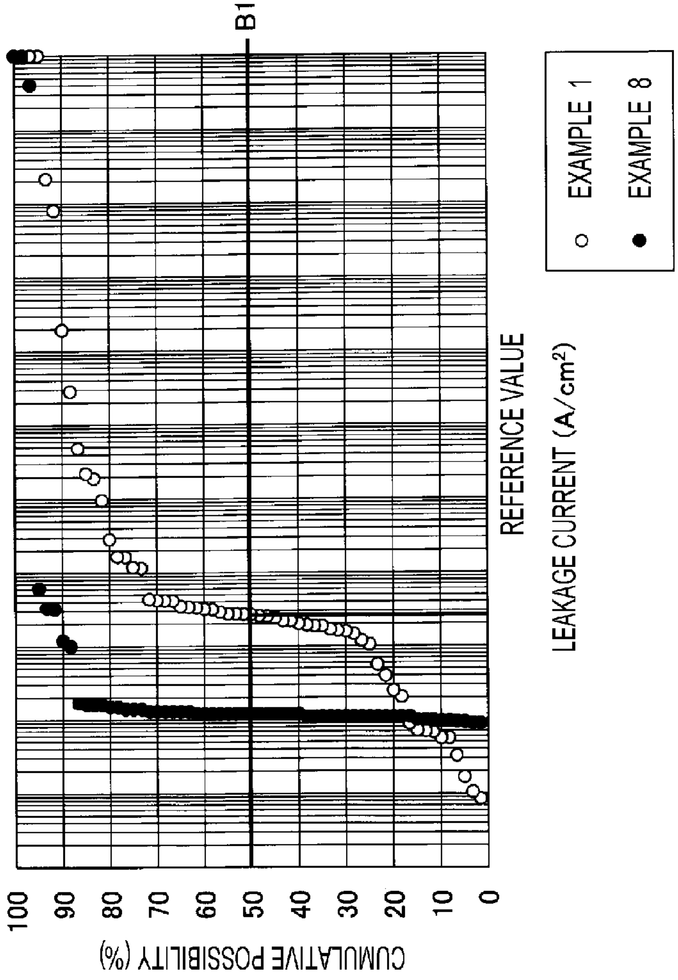
FIG. 7 is a view illustrating evaluation results of process conditions 1 and 8 of Table 1.

FIG. 7 represents the measurement results of Examples 1 and 8. In FIG. 7, the vertical axis represents the cumulative probability (%), and the horizontal axis represents the leakage current (A/$cm^2$). The leakage current is represented by a logarithm. In FIG. 7, the horizontal line B1 represents that the cumulative probability is 50%. The median value of the leakage current of the specimens prepared in Example 1 was used as a reference value of the leakage current.

As confirmed from FIG. 7, in Example 8, the doping process, the pre-processing, the first post-processing, and the second post-processing are performed unlike Example 1, so that the leakage current may be reduced, as compared to Example 1. For example, in Example 8, the median value of the leakage current may be reduced to about 1/20 of the reference value. Further, in Example 8, the deviation of the leakage current may be reduced, so that the leakage current of most of the specimens is smaller than the reference value.

Figure 8:
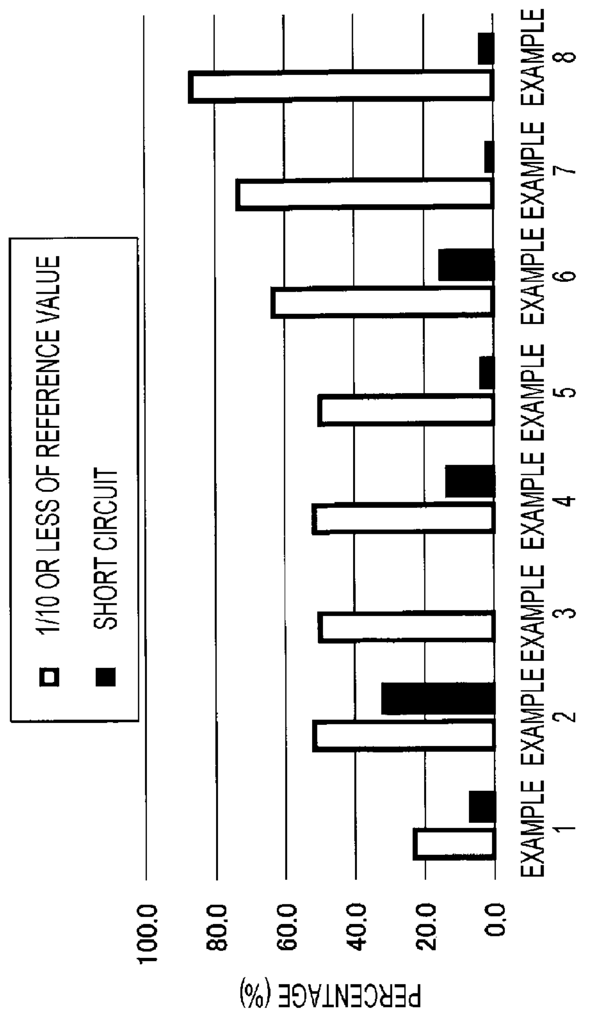
FIG. 8 is a view illustrating evaluation results of process conditions 1 to 8 of Table 1.

FIG. 8 represents the measurement results of Examples 1 to 8 by using bar graphs. In FIG. 8, the "1/10 or Less of Reference Value" represents the percentage of specimens, of which the leakage current is 1/10 or less of the reference value, and the "Short Circuit" represents the percentage of specimens, of which the leakage current exceeds 10 A/$cm^2$.

As confirmed from FIG. 8, in Example 2, the doping process is performed unlike Example 1, so that the percentage of specimens, of which the leakage current is 1/10 of the reference value, may be increased as compared to Example 1. Further, in Examples 3 to 5, at least one of the first post-processing and the second post-processing is performed unlike Example 2, so that the percentage of short-circuited specimens may be decreased as compared to Example 2. Further, in Example 6, the pre-processing is performed unlike Example 2, so that the percentage of specimens, of which the leakage current is 1/10 of the reference value may be increased, and the percentage of short-circuited specimens may be decreased, as compared to Example 2. Further, in Examples 7 and 8, not only the pre-processing but also at least the second post-processing are performed unlike Example 6, so that the percentage of specimens, of which the leakage current is 1/10 of the reference value may be increased, and the percentage of short-circuited specimens may be decreased, as compared to Example 6.

Figure 9:
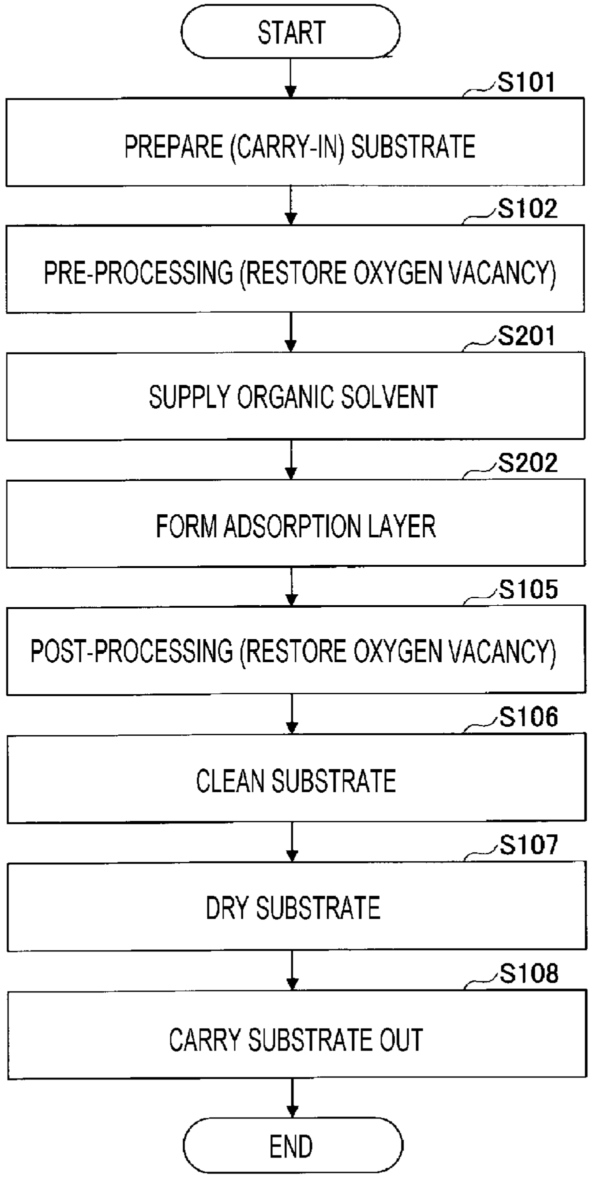
FIG. 9 is a flow chart illustrating a substrate processing method according to a modification.

Next, a substrate processing method according to a modification will be described with reference to FIG. 9. The substrate processing method according to the modification includes steps S101, S102, S105 to S108, S201, and S202 illustrated in FIG. 9. Hereinafter, descriptions will be made focusing on differences.

Step S201 includes supplying an organic solvent having a polarity to the substrate. The organic solvent having the polarity includes, for example, a carbonyl compound or an amine compound. The carbonyl compound is not particularly limited, but is, for example, acetone, formaldehyde, or cyclohexanone. The amine compound is not particularly limited, but is, for example, triethylamine or trimethylamine.

Step S201 above includes, for example, ejecting the organic solvent from the nozzle disposed above the substrate 10 onto the surface of the high-dielectric film 13, in a state where the substrate 10 is held horizontally with the high-dielectric film 13 facing upward, to form the liquid film of the organic solvent. At that time, the substrate 10 may be rotated. Further, the nozzle may scan the substrate 10 in the radial direction. The nozzle may be a two-fluid nozzle, and may supply a mist of the organic solvent to the substrate 10. The organic solvent is recovered by the cup 26 (see FIG. 11).

Further, step S201 above may include immersing the substrate 10 in the organic solvent stored in the processing tank. When the substrate 10 is immersed in the organic solvent, a plurality of substrates 10 may be collectively processed. The organic solvent may be supplied in a gas state, rather than the liquid state, to the substrate 10.

Figure 10:
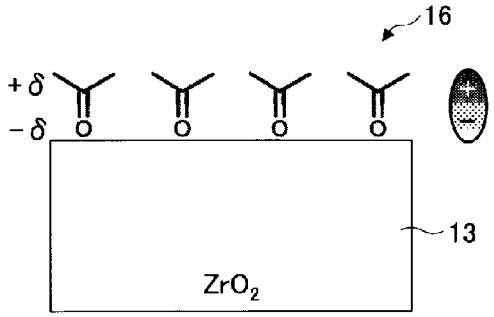
FIG. 10 is a cross-sectional view illustrating another example of the dipoles formed on the surface of the high-dielectric film.

Step S202 includes adsorbing the organic solvent onto the surface of the high-dielectric film 13 to form an adsorption layer containing the organic solvent. When the carbonyl compound is supplied as the organic solvent, the carbonyl groups adsorb onto the surface of the high-dielectric film 13, thereby forming an adsorption layer 16 as illustrated in FIG. 10. The adsorption layer 16 is a monolayer, and its thickness is, for example, one to five times the thickness of one molecule of the organic solvent.

With the formation of the adsorption layer 16, dipoles are formed on the surface of the high-dielectric film 13. As a result, as in the case where the doping layer 14 is formed instead of the adsorption layer 16, the Schottky barrier may be modulated as indicated by the arrow A1 in FIG. 5, so that the flow of electrons indicated by the arrow A2 in FIG. 5 may be stopped. Therefore, the leakage current may be reduced while suppressing the increase in film thickness of the high-dielectric film 13.

Next, experimental data will be described with reference to, for example, Table 2. Table 2 represents experimental results of Examples 1 and 9. In Example 9, a TiN film, a $ZrO_2$ film, and a TiN film were formed in this order on a silicon wafer under the same conditions as those in Example 2, except that an "adsorption process" was performed instead of the "doping process." In the adsorption process, the substrate was immersed in acetone for 30 seconds, and subsequently, dried with compressed air. Example 1 is a Comparative Example, and Example 9 is an Example of the present disclosure.

TABLE 2

| | Median Value of Leakage Current (a.u) |
|---|---|
| Example 1 | 1 |
| Example 9 | 0.38 |

As confirmed from Table 2, in Example 9, the adsorption process is performed unlike Example 1, so that the leakage current may be reduced as compared to Example 1. Specifically, in Example 9, the median value of the leakage current is reduced to about 2/5 of the reference value.

Figure 11:
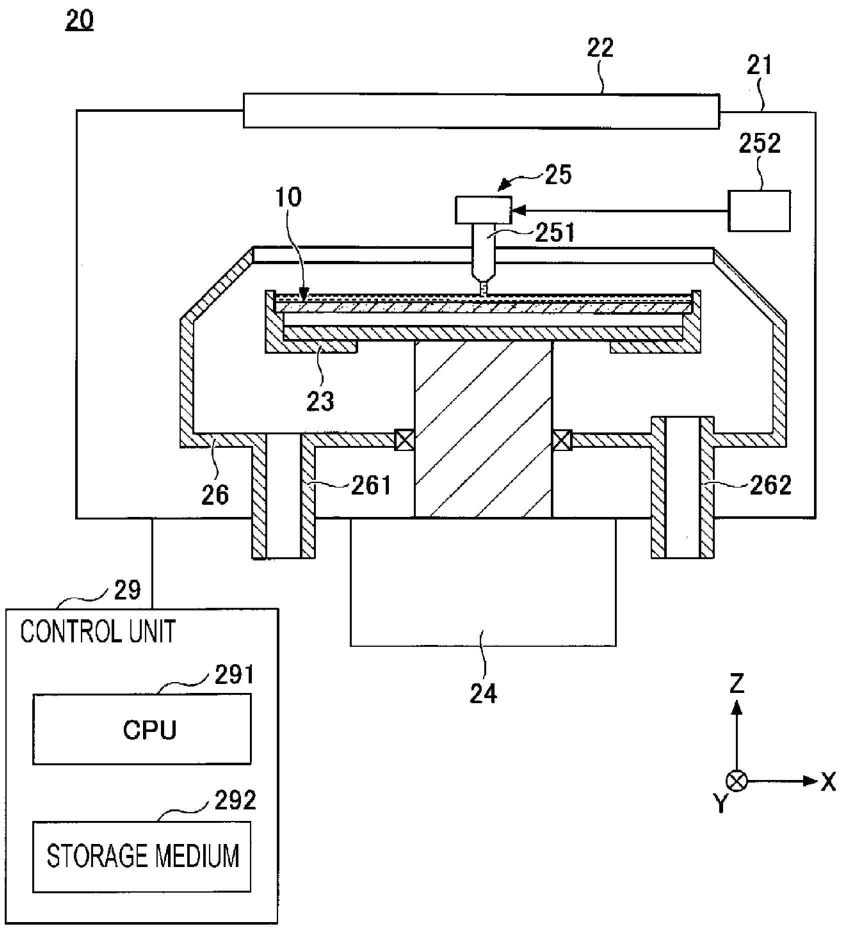
FIG. 11 is a cross-sectional view illustrating an example of a substrate processing apparatus.

Next, the substrate processing apparatus 20 according to the present embodiment will be described with reference to FIG. 11. The substrate processing apparatus 20 includes, for example, a processing container 21, a gas supply mechanism 22, a chuck 23, a chuck drive mechanism 24, a liquid supply mechanism 25, a cup 26, and a control unit 29. The processing container 21 accommodates the substrate 10. The gas supply mechanism 22 is, for example, a fan filter unit, and supplies a gas into the processing container 21. The chuck 23 is a substrate holding unit that holds the substrate 10 inside the processing container 21. The chuck drive mechanism 24 rotates the chuck 23. The liquid supply mechanism 25 supplies a processing liquid to the substrate 10 held by the chuck 23. The cup 26 recovers the processing liquid expelled from the rotating substrate 10. The control unit 29 controls the gas supply mechanism 22, the chuck drive mechanism 24, and the liquid supply mechanism 25.

The liquid supply mechanism 25 includes a nozzle 251 that ejects the processing liquid. The nozzle 251 ejects the processing liquid from above onto the substrate 10 held by the chuck 23. The processing liquid is supplied to the center of the rotating substrate 10 in the radial direction, and spreads radially over the entire substrate 10 by the centrifugal force, thereby forming a liquid film. The number of nozzles 251 is one or more. A plurality of nozzles 251 may eject a plurality of types of processing liquid, or a single nozzle 251 may eject a plurality of types of processing liquid.

The plurality of types of processing liquid may include, for example, the oxidizing chemical liquid used in step S102 or S105, the metal solution used in steps S103 and S104, the cleaning liquid used in step S106, and the organic solvent used in step S201. The liquid supply mechanism 25 corresponds to a liquid supply unit or an organic solvent supply unit described in the claims.

The liquid supply mechanism 25 has a flow path for supplying a processing liquid toward the nozzles 251 for each processing liquid. Further, the liquid supply mechanism 25 includes a flow rate meter, a flow rate controller, and an opening/closing valve in the middle of the flow path. The flow rate meter measures the flow rate of the processing liquid. The flow rate controller controls the flow rate of the processing liquid. The opening/closing valve opens/closes the flow path.

Further, the liquid supply mechanism 25 includes a nozzle drive unit 252 that moves the nozzle 251. The nozzle drive unit 252 moves the nozzle 251 in the horizontal direction perpendicular to the center line of the rotation of the chuck 23. The nozzle drive unit 252 may move the nozzle 251 in the vertical direction. While the nozzle 251 ejects a liquid to the substrate surface, the nozzle drive unit 252 may move the nozzle 251 in the radial direction of the substrate surface.

The cup 26 accommodates the substrate 10 held by chuck 23, and recovers the processing liquid expelled from the rotating substrate 10. A drain pipe 261 and an exhaust pipe 262 are provided at the bottom of the cup 26. The drain pipe 261 discharges a liquid stored in the cup 26. The exhaust pipe 262 discharges a gas inside the cup 26. The cup 26 does not rotate along with the chuck 23, but may rotate along with the chuck 23.

The control unit 29 is, for example, a computer, and includes a central processing unit (CPU) 291 and a storage medium 292 such as a memory. The storage medium 292 stores programs for controlling various processes performed in the substrate processing apparatus 20. The control unit 29 controls the operation of the substrate processing apparatus 20 by causing the CPU 291 to execute the programs stored in the storage medium 292, so as to implement the substrate processing method illustrated in FIG. 2 or 9.

While the embodiments of the substrate processing method and the substrate processing apparatus according to the present disclosure have been described, the present disclosure is not limited to the embodiments. Various changes, modification, substitution, addition, deletion, and combination may be made within the scope described in the claims. Such changes, modification, substitution, addition, deletion, and combination also fall within the technical scope of the present disclosure.

LIST OF REFERENCE NUMERALS

10 substrate
13 high-dielectric film
14 doping layer

What is claimed is:

1. A substrate processing method comprising:
preparing a substrate, on which a high-dielectric-constant film having a higher permittivity than a $SiO_2$ film is formed;
supplying, to the substrate, a metal solution containing a second metal element having a higher electronegativity or a lower valence than a first metal element contained in the high-dielectric-constant film; and
forming a doping layer, in which the first metal element has been substituted with the second metal element, on a surface of the high-dielectric-constant film.

2. The substrate processing method according to claim 1, wherein the second metal element includes one or more selected from Co, Ni, Mo, W, V, Cr, and Nb.

3. The substrate processing method according to claim 1, wherein the metal solution is an aqueous solution of an inorganic acid salt containing the second metal element.

4. The substrate processing method according to claim 1, wherein a surface density of the second metal element on the surface of the high-dielectric-constant film is $1\times10^{10}$ atoms/cm$^2$ or more and $1\times10^{15}$ atoms/cm$^2$ or less.

5. The substrate processing method according to claim 1, further comprising:
before the forming the doping layer, restoring an oxygen vacancy in the high-dielectric-constant film with an oxidant.

6. The substrate processing method according to claim 5, wherein the oxidant is an oxidizing chemical liquid.

7. The substrate processing method according to claim 1, further comprising:
after the forming the doping layer, restoring the oxygen vacancy in the high-dielectric-constant film with the oxidant.

8. The substrate processing method according to claim 1, further comprising:
after the forming the doping layer, restoring the oxygen vacancy in the high-dielectric-constant film by heating the substrate in an atmosphere containing oxygen gas.

9. The substrate processing method according to claim 1, further comprising:
after the forming the doping layer, restoring the oxygen vacancy in the high-dielectric-constant film by irradiating the substrate with an ultraviolet light in an atmosphere containing oxygen gas.

10. The substrate processing method according to claim 1, further comprising:
after the forming the doping layer, cleaning a back surface of the substrate opposite to the doping layer or a bevel of the substrate with a cleaning liquid, thereby removing the second metal element adhering to the back surface or the bevel.

11. The substrate processing method according to claim 1, wherein the high-dielectric-constant film includes a zirconium oxide film or a hafnium oxide film.

12. The substrate processing method according to claim 1, wherein the high-dielectric-constant film is formed on a first electrode, and a second electrode is formed on the high-dielectric-constant film.

* * * * *